(12) United States Patent
Drost et al.

(10) Patent No.: US 7,026,867 B2
(45) Date of Patent: Apr. 11, 2006

(54) FLOATING INPUT AMPLIFIER FOR CAPACITIVELY COUPLED COMMUNICATION

(75) Inventors: Robert J. Drost, Mountain View, CA (US); Ronald Ho, Mountain View, CA (US); Ivan E. Sutherland, Santa Monica, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 44 days.

(21) Appl. No.: 10/879,606

(22) Filed: Jun. 28, 2004

(65) Prior Publication Data
US 2005/0285683 A1   Dec. 29, 2005

(51) Int. Cl.
*H03F 1/02* (2006.01)
(52) U.S. Cl. .......................................... 330/9; 330/302
(58) Field of Classification Search .................... 330/9, 330/302, 307; 361/782, 760; 438/381; 327/94
See application file for complete search history.

(56) References Cited

U.S. PATENT DOCUMENTS

| | | | |
|---|---|---|---|
| 4,697,152 A | 9/1987 | Westwick ........................ 330/9 |
| 5,109,261 A | 4/1992 | Mead et al. .................... 357/30 |
| 5,160,899 A | 11/1992 | Anderson et al. ............. 330/288 |
| 5,629,838 A | 5/1997 | Knight et al. ................ 361/782 |
| 6,252,454 B1 * | 6/2001 | Thompson et al. ............. 330/9 |
| 6,456,159 B1 | 9/2002 | Brewer .......................... 330/9 |
| 6,556,072 B1 * | 4/2003 | Nicollini et al. ............. 327/554 |
| 6,728,113 B1 | 4/2004 | Knight et al. ................ 361/760 |
| 6,812,784 B1 * | 11/2004 | Michalski ....................... 330/9 |
| 6,916,719 B1 | 7/2005 | Knight et al. ................ 438/381 |
| 6,958,646 B1 * | 10/2005 | Colleran et al. ................ 330/9 |
| 2003/0098724 A1 | 5/2003 | Nishizono ..................... 327/94 |

\* cited by examiner

*Primary Examiner*—Henry Choe
(74) *Attorney, Agent, or Firm*—Park, Vaughan & Fleming LLP

(57) ABSTRACT

One embodiment of the present invention provides a capacitively-coupled receiver amplifier that has an input with no DC coupling. A DC voltage is programmed on the input. During programming, a transmitter is held at a voltage at a midpoint between a voltage that represents a logical "1" and a voltage that represents a logical "0" and the input voltage of the receiver amplifier is programmed to be substantially the switching-threshold voltage for the receiver amplifier. Then, during normal data communication, the transmitter drives high and low electrical signals that are coupled to the receiver amplifier. Since the input of the receiver amplifier has been substantially set to the DC voltage, the receiver amplifier need not control the DC voltage of the input for each transition in the electrical signals.

9 Claims, 6 Drawing Sheets

US 7,026,867 B2

FLOATING INPUT AMPLIFIER FOR CAPACITIVELY COUPLED COMMUNICATION

GOVERNMENT LICENSE RIGHTS

This invention was made with United States Government support under Contract No. NBCH020055 awarded by the Defense Advanced Research Projects Administration. The United States Government has certain rights in the invention.

BACKGROUND

1. Field of the Invention

The present invention relates to electronic circuits on semiconductor chips. More specifically, the present invention relates to a capacitively coupled amplifier that facilitates communication between semiconductor chips.

2. Related Art

Advances in semiconductor technology presently make it possible to integrate large-scale systems, including tens of millions of transistors, into a single semiconductor chip. Integrating such large-scale systems onto a single semiconductor chip increases the speed at which such systems can operate, because signals between system components do not have to cross chip boundaries, and are not subject to lengthy chip-to-chip propagation delays. Moreover, integrating large-scale systems onto a single semiconductor chip significantly reduces production costs, because fewer semiconductor chips are required to perform a given computational task.

Unfortunately, these advances in semiconductor technology have not been matched by corresponding advances in inter-chip communication technology. Semiconductor chips are typically integrated onto a printed circuit board that contains multiple layers of signal lines for inter-chip communication. However, signal lines on a semiconductor chip are about 100 times more densely packed than signal lines on a printed circuit board. Consequently, only a tiny fraction of the signal lines on a semiconductor chip can be routed across the printed circuit board to other chips. This problem is beginning to create a bottleneck that continues to grow as semiconductor integration densities continue to increase.

Researchers have begun to investigate alternative techniques for communicating between semiconductor chips. One promising technique involves integrating arrays of capacitive transmitters and receivers onto semiconductor chips to facilitate inter-chip communication. If a first chip is situated face-to-face with a second chip so that transmitter pads on the first chip are capacitively coupled via a coupling capacitor with receiver pads on the second chip, it becomes possible to transmit electrical signals directly from the first chip to the second chip without having to route the electrical signal through intervening signal lines within a printed circuit board.

However, capacitively coupled inter-chip communication poses technical challenges. For example, the coupling capacitor blocks the transmission of a DC component in the electrical signals. This limitation requires a receiver amplifier to set a DC voltage of an input to the receiver amplifier. It is difficult to set the DC voltage in order to balance signal and noise considerations. The DC voltage should ideally sensitize the receiver amplifier to transitions in a coupled electrical signal, but should desensitize the receiver amplifier to noise from adjacent channels and circuits. Exacerbating the challenge of setting the DC voltage, the coupling capacitance may vary over two or more orders of magnitude, causing a large variation in signal and noise amplitudes.

FIG. 1 shows an existing circuit 100 for receiving data 106 sent through a coupling capacitor 110. The transmitter circuit is a simple inverter 112 that produces a data signal on a transmitter pad at node Vtx 114 that transitions between ground and Vdd. Note that parasitic capacitor 116, coupled to a grounding mechanism 108 for coupling node Vtrx 114 to electrical ground, does not affect the amplitude of the data signal. Rather, capacitor 116 only slows the transitions in the data signal on node Vtx 114.

The coupling capacitor 110 couples an electrical signal corresponding to the data signal onto a receiver pad at node Vrx 118. The amplitude of the electrical signal on node Vrx 118 is given by the capacitor divider that includes the coupling capacitor 110 divided by the total capacitance on node 118, including a parasitic capacitor 120. A receiver circuit 122 includes a forward path 124 and a reverse path 126 in a feedback loop. The forward path 124 uses a first inverter 128 and a second inverter 130 to amplify the small electrical signal on node Vrx 118 to full digital signal levels. The reverse path 126 uses an inverter 132 that drives voltages Vhi 134 or Vlo 136 back onto node Vrx 118. Voltages Vhi 134 and Vlo 136 are set slightly higher and lower than a switching-threshold voltage, Vth, of the first inverter 128 in the forward path 124 in the receiver circuit 122. For example, Vhi 134 maybe 50 to 150 mV above Vth, and Vlo 136 maybe 50 to 150 mV below Vth.

Resistor Rfb 138 controls a time constant of the feedback loop to be slower than a transition time of the transitions in the data signal on node Vtx 114. The inverter 132 creates a latching action to hold a transition in the electrical signal until the next transition occurs. Therefore, the inverter 132 sets the DC voltage of an input of the receiver circuit 122.

However, the DC voltages may have no relation to the actual amplitude of the data signal on node Vtx 114 and the electrical signal coupled from Vtx 114 through the coupling capacitor 110 to node Vrx 118. For example, DC voltages Vhi 134 and Vlo 136 of 150 mV above and below Vth, respectively, may be suitable when the capacitance of the coupling capacitor 110 is large. When the capacitance of the coupling capacitor 110 is smaller, however, the coupling capacitor 110 may not result in a large enough amplitude of the electrical signal on node Vrx 118 to cross the switching-threshold voltage Vth. Alternatively, DC voltages Vhi 134 and Vlo 136 of 50 mV above and below Vth, respectively, may allow the combination of crosstalk noise and the electrical signal on node Vrx 118 to cross the switching-threshold voltage Vth of the first inverter 128 resulting in an erroneous output 140.

What is needed is an electronic circuit to facilitate capacitive inter-chip communications without the problems listed above.

SUMMARY

One embodiment of the present invention provides an electronic circuit and method for receiving electrical signals during capacitively coupled communication between a first semiconductor die and a second semiconductor die. An electrical signal is received on a receiver pad from a transmitter pad. The input signal is amplified in an amplifier mechanism that has substantially no DC coupling to an input of the amplifier mechanism. The input voltage of the input is selectively initialized by suspending data transmission on the transmitter pad and setting a voltage on the transmitter pad to a midpoint between a voltage that represents a logical "1" and a voltage that represents a logical "0". Next, a voltage generated by a voltage offset correction mechanism is coupled to the input of the amplifier mechanism in order to equilibrate the input voltage of the input to a switching-threshold voltage of a first stage in the amplifier mechanism.

After the input voltage of the input of the amplifier mechanism substantially stabilizes at the switching-threshold voltage of the first stage, the voltage offset correction mechanism is uncoupled from the input. Then, data transmission on the transmitter pad is resumed. In this way, a small input voltage swing on the input is able to trigger an amplified output signal voltage swing.

In a variation on this embodiment, the coupling and uncoupling of the voltage offset correction mechanism and the equilibrating of the input voltage of the input to the switching-threshold voltage of the first stage is accomplished using a technique, such as hot-electron programming, Fowler-Nordheim programming, a wire that is subsequently cut or ultra-violet light programming, where transistors coupled to the input are illuminated with light having wavelengths substantially in the ultraviolet.

In another variation on this embodiment, the amplifier mechanism includes one or more cascaded CMOS inverter stages. In this variation, the first stage of the amplifier mechanism is, therefore, a CMOS inverter stage. The gain of the amplifier mechanism is selected such that the small input voltage swing on the input is amplified to the amplified output signal voltage swing.

In yet another variation on this embodiment, selectively initializing the input voltage of the input of the amplifier mechanism involves setting a bias voltage on one terminal of a capacitor after uncoupling the voltage offset generating mechanism from the input and before resuming data transmission on the transmitter pad. The other terminal of the capacitor is coupled in parallel with the input of the amplifier mechanism. This bias voltage allows fine tuning of the input voltage of the input to the switching-threshold voltage of the first stage of the amplifier mechanism. The bias voltage is selected such that the amplified output signal voltage swing is symmetric between the voltage that represents a logical "1" and the voltage that represents a logical "0".

Several additional variations on this embodiment are also provided.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

A Single-Ended Floating-Input Amplifier

Figure 1:
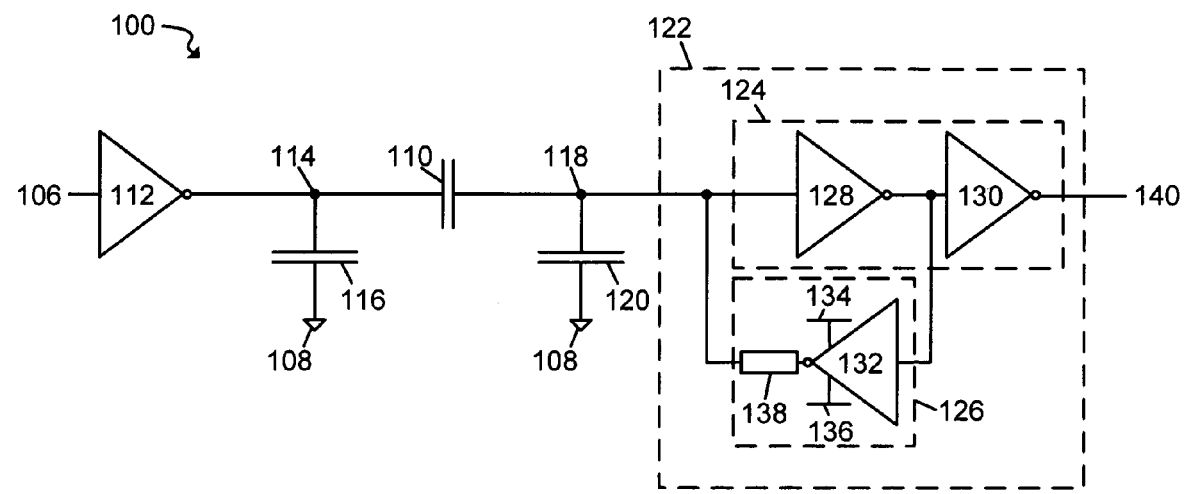
FIG. 1 illustrates a prior art electronic circuit for receiving capacitively coupled electrical signals.
Figure 2:
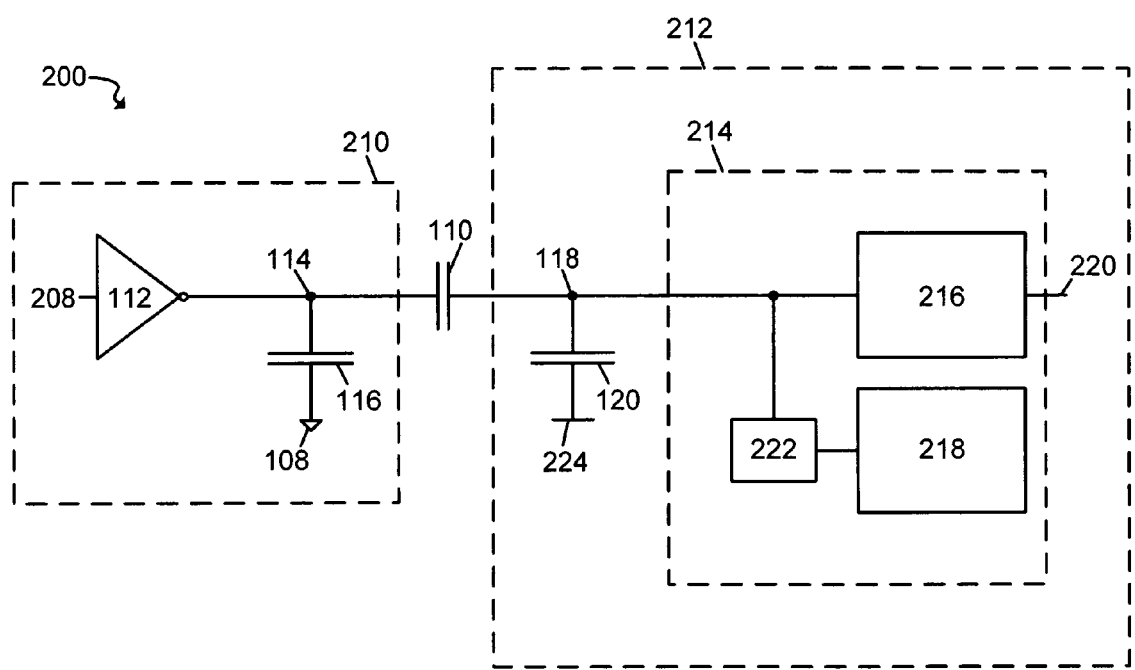
FIG. 2 illustrates an electronic circuit for receiving capacitively coupled electrical signals in accordance with an embodiment of the present invention.

FIG. 2 illustrates an electric circuit 200 in accordance with an embodiment of the present invention that facilitates capacitive communication of data 208 in the form of electrical signals between a first semiconductor die 210 and a second semiconductor die 212. The inverter 112 in the transmitter circuit and the coupling capacitor 110 are the same as in the discussion of FIG. 1. The receiver circuit 214 coupled to a receiver pad at node Vrx 118 includes an amplifier mechanism 216 and a voltage offset correction mechanism 218. The amplifier mechanism 216 has two characteristics. First, it provides a large gain to amplify small electrical signals coupled onto node Vrx 118 into an amplified output voltage swing corresponding to full-swing digital signals levels on an output 220. Second, an input of the amplifier mechanism 216 coupled to node Vrx 118 has no DC coupling.

The voltage offset correction mechanism 218 has two modes of operation. In the first mode of operation, the voltage offset correction mechanism 218 selectively initializes an input voltage of the input to the amplifier mechanism 216. In this mode, the voltage offset correction mechanism 218 is coupled to node Vrx 118 using a charge transfer mechanism 222. In a variation on this embodiment, the charge transfer mechanism 222 is hot-electron programming, Fowler-Nordheim programming or ultra-violet light programming. While transmission of data 208 on node Vtrx 114 is suspended, a voltage at a midpoint between a voltage that represents a logical "0" and a voltage that represents a logical "1" is applied to node Vtrx 114 using a voltage generating mechanism (not shown). The voltage offset correction mechanism 218 drives charge onto and off of node Vrx 118 to equilibrate node Vrx 118 and thus the input of the amplifier mechanism 216 to a switching-threshold voltage for a first stage (not shown) of the amplifier mechanism 216.

During the second mode of operation, the charge transfer mechanism 222 discontinues transferring charge to the voltage offset correction mechanism 218 from node Vrx 118 such that there is no DC coupling to the input of the amplifier mechanism 216. Transmission of data 208 on node Vtrx 114 is resumed. A DC voltage substantially set by the voltage offset correction mechanism 218 on node Vrx 118 in the previous mode of operation allows the transitions in the electrical signals coupled onto node Vrx 118 to trigger the amplified output voltage swing on node 220.

FIG. 2 also illustrates how the DC voltage on node Vrx 118 may be fine tuned to an optimal level, centering the electrical signals coupled onto node Vrx 118 about the switching-threshold voltage of the amplifier mechanism 216. After the voltage offset generating mechanism 218 is uncoupled from node Vrx 118 and before the resumption of the transmission of data 208 on node Vtrx 114, a bias voltage 224 is applied to one terminal of capacitor 120 with a voltage generating mechanism (not shown). Since another terminal of the capacitor 120 is coupled in parallel with node Vrx 118, and thus to the input of the amplifier mechanism 216, the bias voltage 224 allows fine tuning of the DC voltage on node Vrx 118 to the switching-threshold voltage of the first stage of the amplifier mechanism 216. The bias voltage 224 is selected such that the amplified output voltage swing on the output 220 is substantially symmetric about the midpoint between the voltage that represents a logical "0" and the voltage that represents a logical "1".

Figure 3:
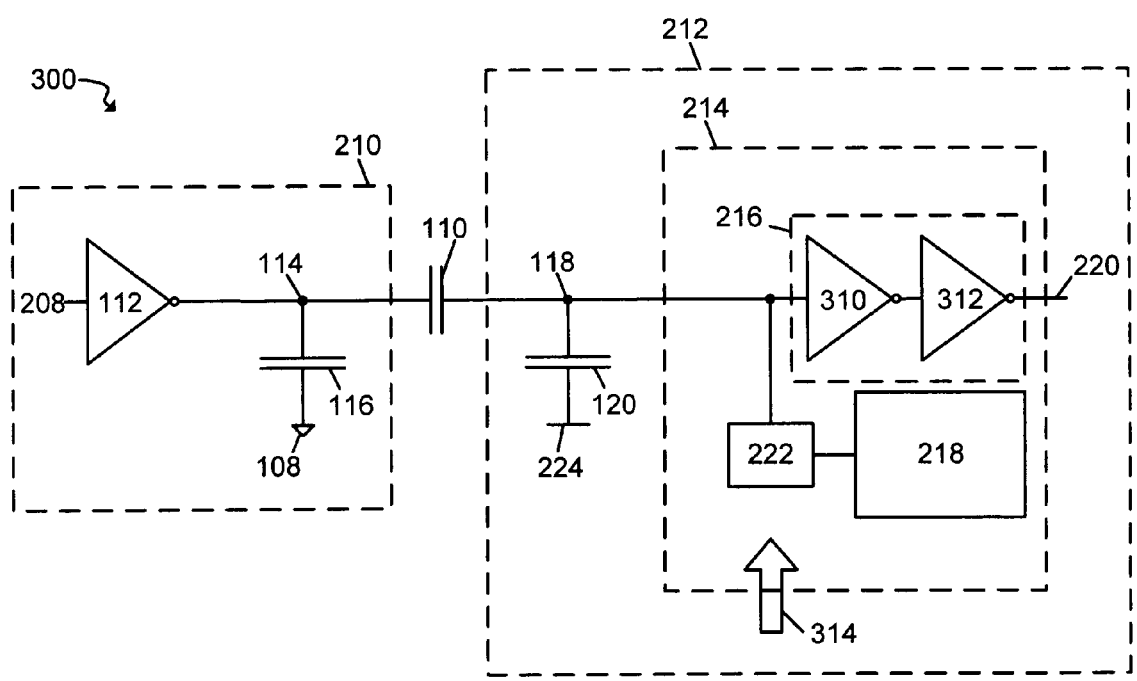
FIG. 3 illustrates an electronic circuit for receiving capacitively coupled electrical signals in accordance with an embodiment of the present invention.

FIG. 3 illustrates an electronic circuit 300 that is a variation on this embodiment of the present invention. The amplifier mechanism 216 uses one or more cascaded CMOS inverter stages. FIG. 3 illustrates two cascaded CMOS inverter stages, a first CMOS inverter stage 310 and a second CMOS inverter stage 312. The input of the first stage 310 is coupled to node Vrx 118. An output of the second stage 312 is coupled to the output 220. The gain of the amplifier mechanism 216 is selected such that the small input electrical signal swing on the input is amplified to the amplified output voltage swing on the output 220.

There are several techniques suitable for transferring charge and thereby equilibrating node Vrx 118 and thus the input of the amplifier mechanism 216 to the switching-threshold voltage for the first stage 310 of the amplifier mechanism 216. One technique, illustrated in FIG. 3, is ultraviolet-light programming. Light 314, having wavelengths that are substantially in the ultraviolet, generated by a light source (not shown), selectively illuminates transistors in the charge transfer mechanism 222 in order to couple the voltage generated by the voltage offset correction mechanism 218 to node Vrx 118. The light 314 creates a small current across a transistor oxide that imparts a substantially fixed charge onto a transistor gate in the transistors.

Figure 4A:
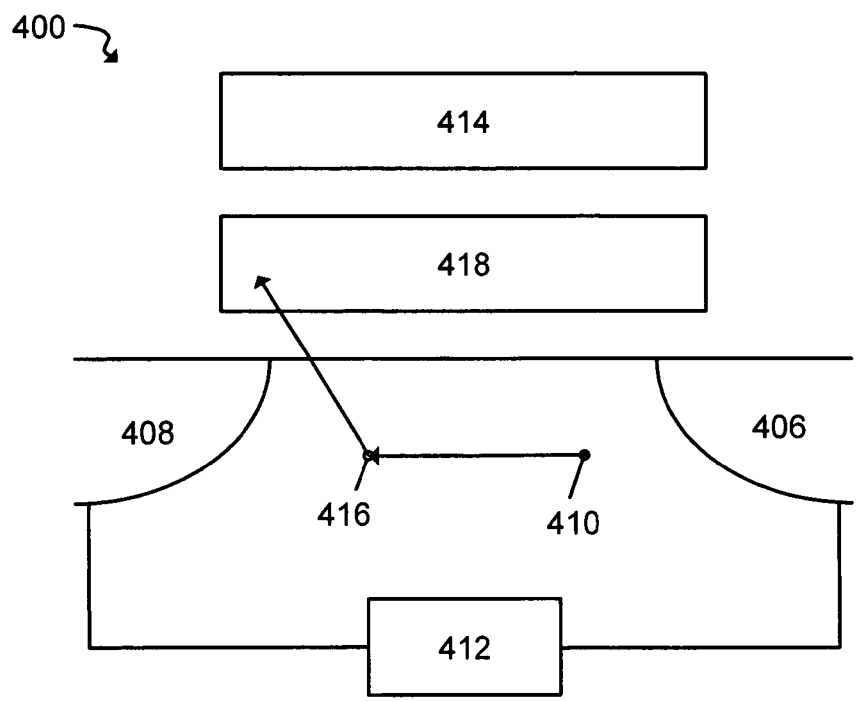
FIG. 4A illustrates a method for programming the input of an amplifier mechanism in accordance with an embodiment of the present invention.
Figure 4B:
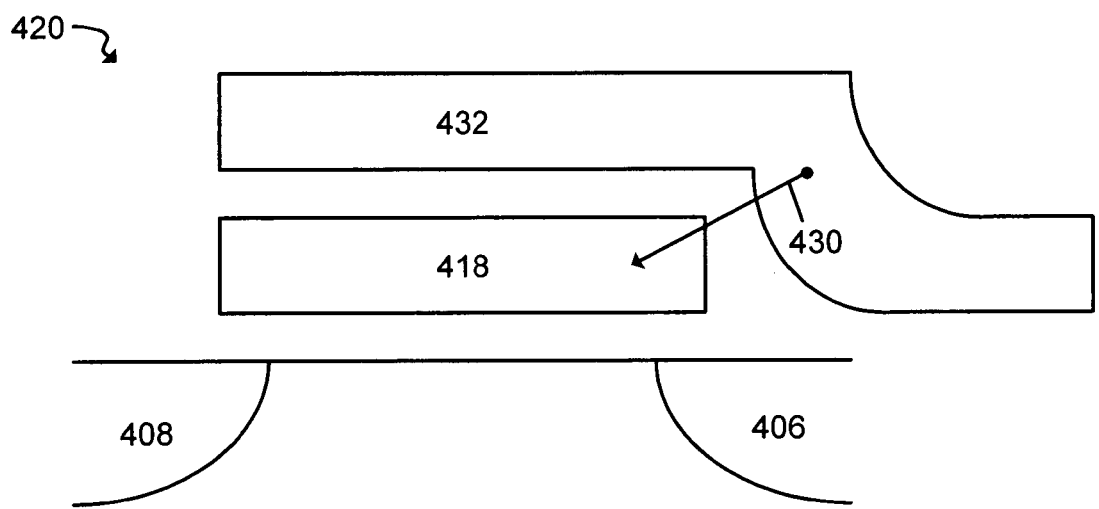
FIG. 4B illustrates a method for programming the input of the amplifier mechanism in accordance with an embodiment of the present invention.

FIGS. 4A and 4B illustrates two additional techniques, hot-electron programming and Fowler Nordheim programming, that are similar to the techniques used to program a programmable read-only memory (PROM) or an electrically-erasable programmable read-only memory (EEPROM). These techniques, as well as the ultraviolet-light programming, are described in IEEE Standard No. 1005-1998 entitled "IEEE Standard Definitions and Characterization of Floating Gate Semiconductor Arrays". In FIG. 4A, hot electrons 410 are deliberately created by biasing a transistor 400 with a high drain-to-source voltage 412 between a source 406 and a drain 408 and applying a voltage on a control node 414. Note that the drain-to-source voltage 412 and the voltage on the control node 414 are generated by a voltage generating mechanism (not shown). The hot electrons 410 are transferred by scattering 416 to a floating node 418. In Fowler-Nordheim programming 420, shown in FIG. 4B, a thin oxide permits a small current 430 to transfer charge to the floating node 418 by quantum mechanical tunneling when a voltage on a program node 432, generated by a voltage mechanism (not shown), creates a large enough potential difference across the oxide. Depending on the leakage from the floating node 418, the programmed DC voltage will remain for an extended period of time. For example, programmable memories such as EEPROMs can retain data for 40 or more years.

Figure 5:
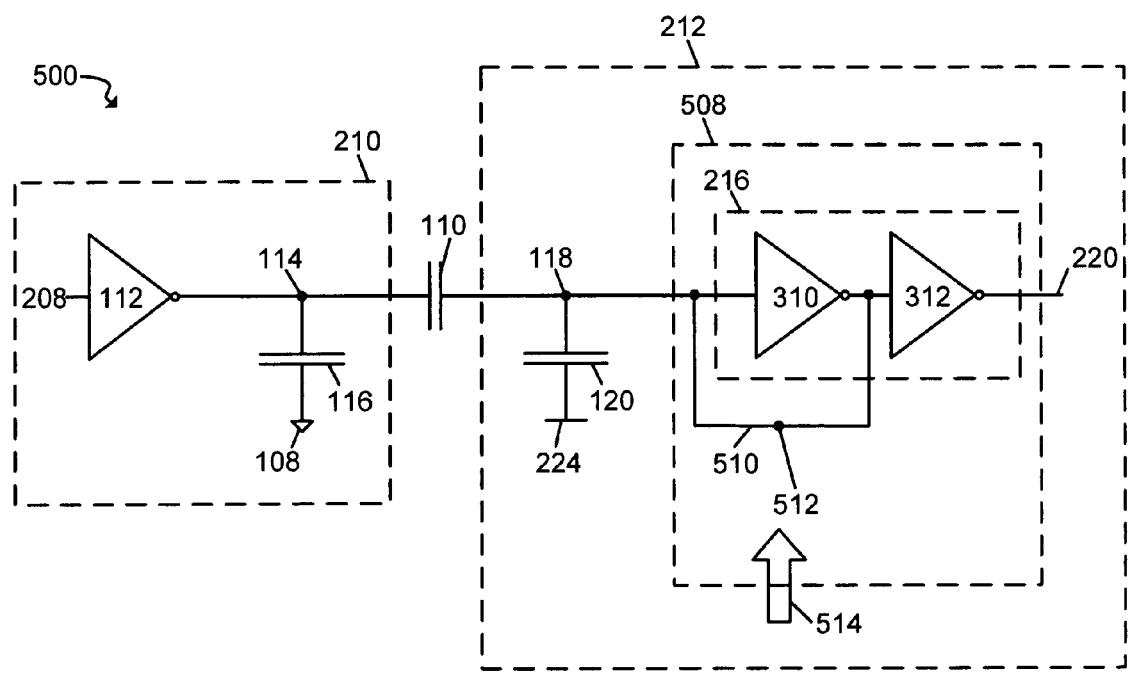
FIG. 5 illustrates an electronic circuit for receiving capacitively coupled electrical signals in accordance with an embodiment of the present invention.

FIG. 5 illustrates an electronic circuit 500 in another embodiment in accordance with the present invention. The electronic circuit 500 allows one-time programming of the input voltage of the input of the amplifier mechanism 216 using a technique such as laser-wire programming. The receiver circuit 214 (shown in FIG. 2) is modified, replacing the voltage offset generating mechanism 218 (shown in FIG. 2) and the charge transfer mechanism 222 (shown in FIG. 2) with a wire 510 coupling an output of the first stage 310 of the amplifier mechanism 216 to node Vrx 118 and thus to the input of the amplifier mechanism 216 thereby producing receiver circuit 508.

While transmission of data 208 on node Vtrx 114 is suspended, a voltage at a midpoint between the voltage that represents a logical "0" and the voltage that represents the logical "1" is applied to node Vtrx 114 using a voltage generating mechanism (not shown). When node Vrx 118 has equilibrated, the first stage 310 has programmed its input voltage to be substantially equal to its output voltage. A laser (not shown) produces laser light 514, or another suitable mechanism for breaking the wire 510, then uncouples the output of the first stage 310 from node Vrx 118. A location 512 where the wire 510 may be broken may be on the circuit side of the second semiconductor die 212 or the back-side of the second semiconductor die 212 by using through-chip vias. Laser-wire programming is described in K. Arndt et al., "Reliability of Metal Activated Fuses in DRAMs," IEEE/CPMT International Electronics Manufacturing Technology Symposium, pp. 389–394 (1999). In a variation on this embodiment, ultra-violet light programming may be used while node Vrx 118 is equilibrating.

A Differential Floating-Input Amplifier

Figure 6:
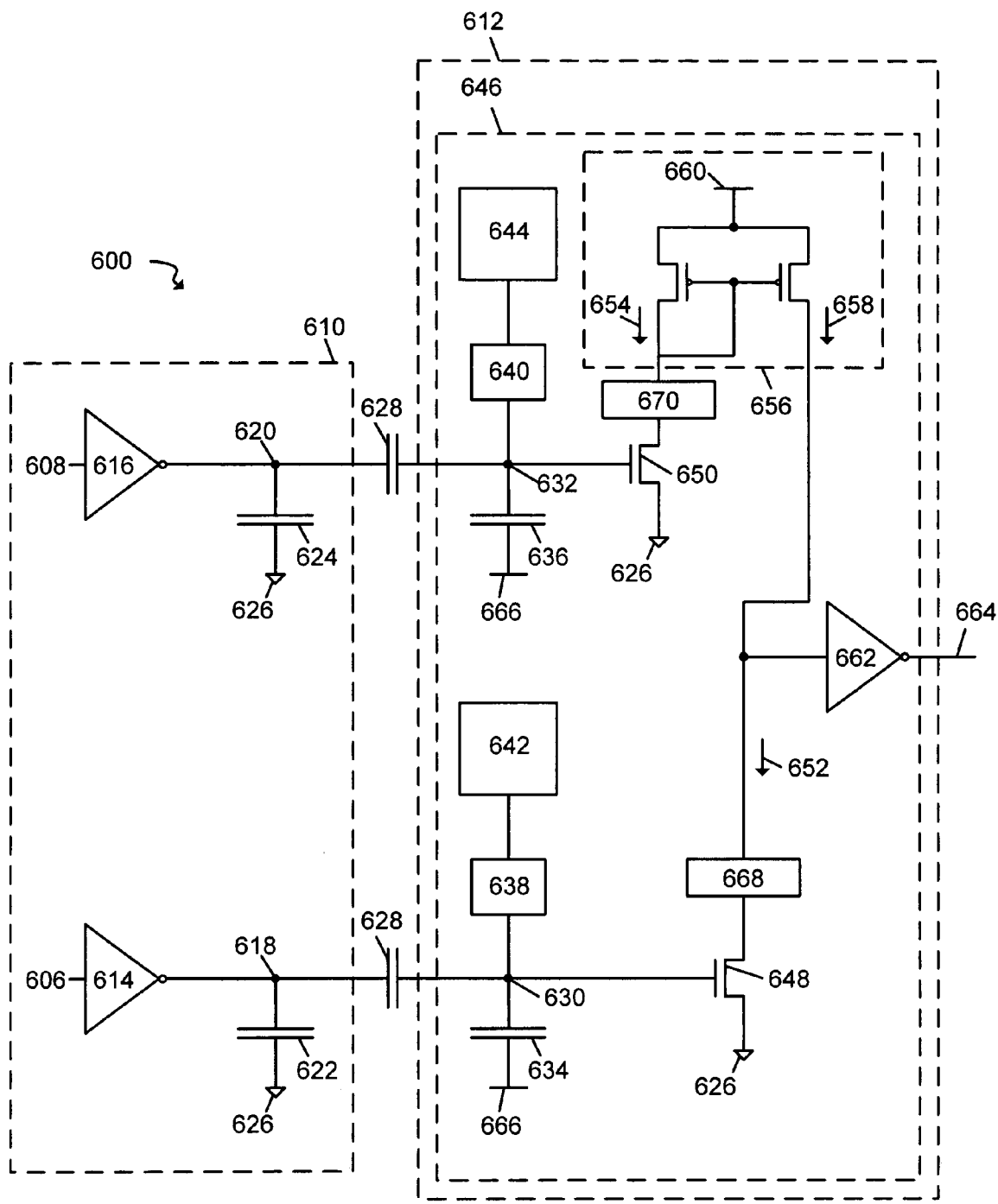
FIG. 6 illustrates an electronic circuit for receiving capacitively coupled electrical signals in accordance with an embodiment of the present invention.

FIG. 6 illustrates an electronic circuit 600 in accordance with a differential embodiment of the present invention. Differential signaling improves immunity to noise. In the electronic circuit 600, the electronic circuit 200 (shown in FIG. 2) is replicated for two data paths, including a first semiconductor die 610 and a second semiconductor die 612, a first inverter 614 and a second inverter 616 in the transmitter circuit, a first node Vtrx 618 and a second node $\overline{Vtrx}$ 620, a capacitor 622 and a capacitor 624, each of which is coupled to a grounding mechanism 626 for coupling nodes Vtrx 618 and $\overline{Vtrx}$ 620 to electrical ground, a coupling capacitor 628, a first node Vrx 630 and a second node $\overline{Vrx}$ 632, a first parasitic capacitor 634 and a second parasitic capacitor 636, a first charge transfer mechanism 638 and a second charge transfer mechanism 640, and a first voltage offset correction mechanism 642 and a second voltage offset correction mechanism 644. One data path communicates data 606, the other communicates data 608 that is the logical inverse of the data 606.

In a variation on this embodiment, the first charge transfer mechanism 638 and the second charge transfer mechanism 640 employ techniques suitable for transferring charge and thereby equilibrating nodes Vrx 630 and $\overline{Vrx}$ 632 including ultraviolet-light programming, hot-electron programming and Fowler Nordheim programming.

In another variation of this embodiment, the amplifier mechanism 646 involves using a differential amplifier with transistors 648 and 650, which are source-grounded input NMOS transistors, to convert the input voltages on nodes Vrx 630 and $\overline{Vrx}$ 632 into currents $I_1$ 652 and $I_2$ 654. A load 656, which is a PMOS current-mirror, in the differential amplifier reflects the current $I_2$ 654 into current $I_3$ 658. Note that the load 656 is connected to a supply voltage 660, generated by a voltage generating mechanism (not shown). In combination with the transistor 648 connected to Vrx 630, the load 656 converts the differential input voltage into a difference of currents $I_1$ 652 and $I_3$ 658. The inverter 662 in the differential amplifier amplifies the difference of currents $I_1$ 652 and $I_3$ 658 to produce the amplified output voltage swing corresponding to the full-swing digital signal levels on an output 664.

In a variation on this embodiment (not shown), the amplifier mechanism 646 involves using a differential amplifier with PMOS transistors for transistors 648 and 650 and an NMOS current-mirror as the load 656.

The procedure for selectively initializing nodes Vrx 630 and $\overline{\text{Vrx}}$ 632 and thus the inputs of the amplifier mechanism 646 to the switching-threshold voltages for transistors 648 and 650 is the same as that discussed above for the electronic circuit 200 shown in FIG. 2 except that the voltage applied to nodes Vrx 630 and $\overline{\text{Vrx}}$ 632 while transmission of data 606 and 608 on nodes Vtrx 618 and $\overline{\text{Vtrx}}$ 620 is suspended need not be the voltage at a midpoint between the voltage that represents a logical "0" and the voltage that represents a logical "1". Instead, any reference voltage, generated with a voltage generating mechanism (not shown), applied to nodes Vtrx 618 and $\overline{\text{Vtrx}}$ 620 is sufficient. For example, nodes Vtrx 618 and $\overline{\text{Vtrx}}$ 620 may be coupled to the grounding mechanism 626 thereby coupling nodes Vtrx 618 and $\overline{\text{Vtrx}}$ 620 to electrical ground.

The procedure for fine tuning of the DC voltage on nodes Vrx 630 and $\overline{\text{Vrx}}$ 632 using the bias voltage 666 is the same as that discussed above for the electronic circuit 200 shown in FIG. 2 except that the bias voltage 666 is applied to one terminal of the first parasitic capacitor 634 and one terminal of the second parasitic capacitor 636, where another terminal of the first parasitic capacitor 634 is coupled in parallel with node Vrx 630 and another terminal of the second parasitic capacitor 636 is coupled in parallel with node $\overline{\text{Vrx}}$ 632.

In a variation on this embodiment (not shown), the amplifier mechanism 646 uses one or more cascaded CMOS inverter stages, such as the electronic circuit 300 shown in FIG. 3.

In another variation on this embodiment (not shown), the input voltage of the inputs to the amplifier mechanism 646 coupled to nodes Vrx 630 and $\overline{\text{Vrx}}$ 632 may be programmed with at least one cuttable wire such as the cuttable wire 510 shown in FIG. 5 and a technique such as laser-wire programming. In yet another variation on this embodiment (not shown), ultra-violet light programming may be used while node Vrx 630 and $\overline{\text{Vrx}}$ 632 are equilibrating.

FIG. 6 also illustrates optional hot electron shields 668 and 670 to reduce the energy of hot electrons in the transistors 648 and 650. Electrons become high energy, or "hot," when accelerated by large drain-to-source voltages. Hot electrons may have sufficient energy to scatter through a transistor's gate oxide. Shielding from hot electrons may be important to reduce the gate leakage current in transistors 648 and 650.

In one implementation of the hot electron shields 668 and 670, a common-gate cascode transistor drops the drain voltages of transistors 648 and 650 to about Vcsn–Vtn, where Vtn is the switching-threshold voltage of transistors 648 and 650 and Vcsn is a voltage, generated by a voltage generating mechanism (not shown), that is applied to the gate of the cascode transistor. This reduces the energy of electrons that travel through transistors 648 and 650 but does not substantially change the current sunk by the transistors 648 and 650 so long as the drain voltage is high enough to keep the transistors 648 and 650 in a saturated mode of operation. Alternatively, if few hot electrons are generated given the supply voltage 660 and the switching-threshold voltages of the transistors 648 and 650, the hot electron shields 668 and 670 are not necessary.

The foregoing descriptions of embodiments of the present invention have been presented for purposes of illustration and description only. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A method for amplifying capacitively coupled inter-chip communication signals, comprising:
   receiving an input signal at a capacitive receiver pad from a capacitive transmitter pad;
   amplifying the input signal in an amplifier mechanism, wherein the amplifier mechanism has substantially no DC coupling to an input of the amplifier mechanism; and
   selectively initializing an input voltage of the input of the amplifier mechanism, wherein the initializing involves,
   suspending data transmission on the capacitive transmitter pad and setting a voltage on the capacitive transmitter pad to a middle point between a voltage that represents a logical "1" and a voltage that represents a logical "0",
   coupling a voltage generated by a voltage offset correction mechanism to the input thereby equilibrating the input voltage of the input to a switching-threshold voltage of a first stage in the amplifying mechanism when the capacitive transmitter pad is at the middle point between the voltage that represents a logical "1" and the voltage that represents a logical "0", and thereby allowing a small input signal voltage swing of the input to trigger an amplified output signal voltage swing, and
   after the input voltage of the input substantially stabilizes at the switching-threshold voltage of the first stage, uncoupling the voltage offset correction mechanism from the input and then resuming data transmission on the capacitive transmitter pad.

2. The method of claim 1, wherein selectively initializing the input voltage of the input of the amplifier mechanism involves selectively illuminating transistors coupled to the input with light having wavelengths that are substantially in the ultraviolet thereby coupling the voltage generated by the voltage offset correction mechanism to the input.

3. The method of claim 1, wherein equilibrating the input voltage of the input to the switching-threshold voltage of the first stage is accomplished by a technique selected from the group including hot-electron programming, Fowler-Nordheim programming, ultraviolet-light programming and a wire that is subsequently cut.

4. The method of claim 1, wherein amplifying the input signal in the amplifier mechanism further involves:
   coupling the input of the amplifier mechanism to an input of one or more cascaded CMOS inverter stages, wherein the first stage is therefore a CMOS inverter stage; and
   coupling an output of a final CMOS inverter stage in the cascaded CMOS inverter stages to an output of the amplifier mechanism, whereby a gain of the amplifier mechanism is selected such that the small input signal voltage swing of the input is amplified to the amplified output signal voltage swing.

5. The method of claim 1, wherein selectively initializing the input voltage of the input of the amplifier mechanism further involves setting a bias voltage on one terminal of a capacitor after uncoupling the voltage offset correction mechanism from the input and before resuming data transmission on the capacitive transmitter pad, wherein another terminal of the capacitor is coupled in parallel with the input, and whereby setting the bias voltage allows fine tuning of the input voltage of the input to the switching-threshold voltage of the first stage and whereby the bias voltage is selected such that the amplified output voltage swing is substantially symmetric about the middle point between the voltage that represents a logical "1" and the voltage that represents a logical "0".

6. An electronic circuit for communication between a first semiconductor die and a second semiconductor die, comprising:
- a transmitter mechanism for transmitting a signal on a transmitter pad in the first semiconductor die;
- a receiver circuit for receiving the signal on a receiver pad in the second semiconductor die, wherein the receiver pad is capacitively coupled to the transmitter pad, wherein the receiver circuit includes,
- an amplifier mechanism with an output and an input, having substantially no DC coupling, coupled to the receiver pad, and
- a charge transfer mechanism for selectively coupling a voltage offset correction mechanism to the receiver pad, and whereby the voltage offset correction mechanism is selectively coupled to the receiver pad to selectively initialize an input voltage of the input of the amplifier mechanism to a switching-threshold voltage of the amplifier mechanism thereby allowing a small signal voltage swing of the input to trigger an amplified output signal voltage swing of the output.

7. The electronic circuit of claim 6, wherein the charge transfer mechanism uses a technique selected from the group including hot-electron programming, Fowler-Nordheim programming, ultraviolet-light programming and a wire that is subsequently cut.

8. The electronic circuit of claim 6, wherein the amplifier mechanism includes one or more cascaded CMOS inverter stages, wherein an input of a first stage CMOS inverter stage is coupled to the input of the amplifier and an output of a final CMOS inverter stage in the cascaded CMOS inverter stages is coupled to the output of the amplifier mechanism, whereby a gain of the amplifier mechanism is selected such that the small input signal voltage swing of the input is amplified to the amplified output signal voltage swing of the output.

9. The electronic circuit of claim 6, further comprising a capacitor having one terminal coupled in parallel with the receiver pad and another terminal coupled to a voltage generating mechanism, whereby a bias voltage applied to the capacitor with the voltage generating mechanism fine tunes the input voltage of the input to the switching-threshold voltage and whereby the bias voltage is selected such that the amplified output voltage swing is substantially symmetric about a middle point between a voltage that represents a logical "1" and a voltage that represents a logical "0".

* * * * *